United States Patent
Joo et al.

(10) Patent No.: US 6,833,561 B2
(45) Date of Patent: Dec. 21, 2004

(54) STORAGE CAPACITOR STRUCTURE FOR LCD AND OELD PANELS

(75) Inventors: Seung Ki Joo, 203-101, Bundang Chungang Heights Second Complex, 369-19, Gungnae-dong, Bungdang-gu, Seongnam-si, Kyunggi-do (KR); Seok-Woon Lee, Incheon (KR)

(73) Assignee: Seung Ki Joo, Kyunggi-Do (KR)

( * ) Notice: Subject to any disclaimer, the term of this patent is extended or adjusted under 35 U.S.C. 154(b) by 0 days.

(21) Appl. No.: 10/286,397

(22) Filed: Nov. 1, 2002

(65) Prior Publication Data
US 2003/0102478 A1 Jun. 5, 2003

(30) Foreign Application Priority Data
Nov. 2, 2001 (KR) ................. 10-2001-0068219

(51) Int. Cl.$^7$ .................. H01L 29/04; H01L 31/036
(52) U.S. Cl. ................. 257/75; 257/72; 257/359; 257/70; 257/52; 257/59
(58) Field of Search ............... 257/72, 359, 75, 257/70, 52, 59

(56) References Cited

U.S. PATENT DOCUMENTS

| | | | | |
|---|---|---|---|---|
| 5,243,260 A | * | 9/1993 | Vinouze et al. | 315/169.1 |
| 6,232,173 B1 | * | 5/2001 | Hsu et al. | 438/253 |
| 6,278,130 B1 | * | 8/2001 | Joo et al. | 257/59 |
| 6,537,890 B2 | * | 3/2003 | Joo et al. | 438/404 |
| 6,548,331 B2 | * | 4/2003 | Lee et al. | 438/149 |
| 6,596,573 B2 | * | 7/2003 | Lee et al. | 438/166 |
| 2001/0034088 A1 | * | 10/2001 | Nakamura et al. | 438/166 |
| 2002/0056839 A1 | * | 5/2002 | Joo et al. | 257/63 |
| 2002/0115245 A1 | * | 8/2002 | Chang et al. | 438/166 |
| 2002/0192884 A1 | * | 12/2002 | Chang et al. | 438/164 |
| 2003/0068871 A1 | * | 4/2003 | Chan et al. | 438/486 |

* cited by examiner

Primary Examiner—Amir Zarabian
Assistant Examiner—Ida M. Soward
(74) Attorney, Agent, or Firm—Graybeal Jackson Haley, LLP

(57) ABSTRACT

The present invention relates to a structure and a fabrication method of a storage capacitor used in the pixel region of a display panel such as LCD or OELD. The present invention simultaneously forms a poly-crystalline silicon TFT and a storage capacitor in the pixel region of a display panel using MILC phenomena. By applying MILC inducing metal along at least two edges of storage capacitor, the time required to crystallize the silicon layer in storage capacitor region may be significantly reduced.

12 Claims, 10 Drawing Sheets

STORAGE CAPACITOR STRUCTURE FOR LCD AND OELD PANELS

PRIORITY CLAIM

The present application claims priority from Korean patent application no. 2001-68219, filed Nov. 2, 2001, which is incorporated by reference.

1. Technical Field

The present invention relates to a structure and a fabrication method of a storage capacitor used in pixel region of a liquid crystal display (LCD) panel or an organic electronic luminescent display (OELD) panel. More particularly, the invention relates to a technique of simultaneously forming a crystalline silicon pixel transistor and a storage capacitor using metal induced lateral crystallization (MILC) in pixel region of a thin film transistor (TFT) panel for an LCD or an OELD.

2. Background of the Invention

FIG. 1 schematically illustrates a TFT panel 10 for an LCD including a pixel region 11 and a driving circuit region 12 located in the periphery of the pixel region. When the amorphous silicon layer of a TFT formed on a substrate is crystallized by MILC, the electron mobility of the silicon layer is significantly increased. Using the crystallized silicon layer, a plurality of pixel arrays including a pixel transistor and a storage capacitor may be formed in the pixel region 11. At the same time, driving circuit elements may be formed in the driving circuit region 12. For polycrystalline silicon TFT LCD, hybrid driving methods are widely used. In a hybrid type LCD panel, certain analog circuits such as OP amplifier and DA converter, which are difficult to fabricate with polycrystalline silicon, are provide by using separate integrated circuits, and switching elements such as multiplexer are directly formed on the substrate.

FIG. 2 is an equivalent circuit diagram of a pixel unit formed in the pixel region of the LCD TFT panel 10 illustrated in FIG. 1. Each unit pixel includes a data bus line (Vd); a gate bus line (Vg); a pixel TFT comprising a gate connected to the gate bus line, a source and a drain respectively connected to the data bus line and a pixel electrode; a storage capacitor (Cst) 22 for maintaining the state of the signal applied to a pixel TFT 22; and a liquid crystal ($C_{LC}$) connected in parallel with the storage capacitor. The storage capacitor and the liquid crystal are connected to a common electrode ($V_{COM}$) 24. When a unit pixel is selected by the gate bus signal and voltage is applied by the data bus signal, a storage capacitor 22 connected to a drain of a pixel transistor 21 stores electric charge and maintains the voltage applied to the liquid crystal until next signal is applied. Without a storage capacitor, a driving voltage applied by a pixel transistor may not be maintained until the next signal period. Then, continuous display may not be performed.

OELD panel has a condenser structure including a surface glass comprising a transparent glass and transparent electrode; a metal electrode used as a cathode; and an organic luminescent layer interposed between the transparent electrode and the metal electrode. When voltage is applied between the electrodes, the organic luminescent layer emits light through the surface glass. LCD panels including TFT LCD panel have several limitations such as low response speed, narrow vision angle and high power consumption due to a backlight unit. Because OELD panel is a self-light-emitting device, it has advantages of high response speed, high luminescence, low profile structure and low power consumption.

FIG. 3 is a schematic diagram of an OELD TFT panel 30 including pixel region 31 and a driving circuit region 32 formed in the periphery of the pixel region. When the silicon active layer of the TFT is crystallized by MILC, the electron mobility of the active layer is increased. Thus, using MILC crystallization technique, driving circuit elements of high operation speed can be simultaneously formed in the driving circuit region when forming a plurality of pixel arrays including addressing transistor, storage capacitor and pixel driving transistor in the pixel region 31. As the case of LCD panel, hybrid driving methods are frequently used for driving OELD TFT panels.

FIG. 4A is an equivalent circuit diagram of a unit pixel formed in the pixel region of a voltage-driven type OELD TFT panel 30. Each unit pixel includes a data bus line (Vd); a gate bus line (Vg); and an addressing (switching) TFT comprising a gate connected to the gate bus line and a source and a drain connected to the data bus line. The drain of the addressing TFT 41 is connected to the gate of a pixel driving TFT 43 for receiving a reference voltage (Vdd) and providing a driving voltage (Vc) to organic luminescent material layer. A storage capacitor 42 for maintaining the signal applied to the gate of the pixel driving TFT is also connected in parallel with the pixel driving TFT 43. Since TFT LCD is not a self-light-emitting type device, only one pixel TFT is used in a unit pixel to provide a voltage to a pixel electrode. However, in OELD, data signal may not provide a voltage required to induce the light emission of the organic material. Thus, it has to use a separate pixel driving TFT 43 receiving the output signal of the addressing TFT 41 as a gate signal.

FIG. 4B illustrates an example of the equivalent circuit diagram of a unit pixel in the pixel region of a current-driven type OELD TFT panel 30. A unit pixel of a current-driven type OELD TFT panel includes two addressing TFT's 44, 45, two pixel driving TFT's 47, 48 and one storage capacitor 46. A first addressing TFT 44 is turned on by a signal of a first gate bus line (Vg1) to receive a signal of the data bus line (Vd). A second addressing TFT 45 is turned on by a signal of a first gate bus line ($Vg_2$) and provides the output of the first addressing TFT 44 to the gates of a pair of pixel driving TFT's 47, 48 and to the storage capacitor 46. When electric charge is accumulated in the storage capacitor 46 after the first addressing TFT 44 and the second addressing TFT 45 are turned on, the voltage created in the storage capacitor is applied to the gates of the first and the second pixel driving TFT's 47, 48 to turn on the pixel driving TFT's. The voltage applied by the storage capacitor is maintained even when the second addressing TFT is turned off. Thus the turn on state of the pixel driving TFT's 47, 48 is maintained until the next signal period and they continue to provide the driving current to the unit pixel.

As can be seen from FIGS. 2, 4A and 4B, a storage capacitor for LCD TFT panel or OELD TFT panel is connected to an LCD pixel TFT or to the drain of an OELD addressing TFT (a second addressing TFT for an current-driven type). FIGS. 5A and 5B are a plan view and a sectional view of an LCD pixel TFT or an OELD addressing TFT including a polycrystalline silicon active layer crystallized by MILC, which is connected to a storage capacitor simultaneously formed with the TFT. FIGS. 5A and 5B show a thin film transistor in the left-hand side and a capacitor structure in the right-hand side. The TFT is used as a pixel TFT in an LCD panel and as an addressing TFT in a unit pixel of an OELD panel. The TFT may be used as a second addressing TFT 45 in current-driven type OELD panel as shown in FIG. 4B. In FIGS. 5A and 5B, a drain of the TFT is directly connected to a silicon layer of the capacitor. In actual pixel layout of LCD or OELD, however, they may not be physically connected with each other. Instead, they may be electrically connected with each other by wire.

On the transparent substrate 51, a buffer layer 52 for preventing diffusion of impurities from the substrate 51 is formed. On the buffer layer, an amorphous silicon layer 53 is patterned and a gate insulating layer 54 and a capacitor dielectric layer 55 are formed on the patterned silicon layer. Thereafter, a gate electrode layer 56 and a capacitor electrode 57 are formed on the gate insulating layer and the dielectric layer, respectively. As such, a TFT structure including an amorphous silicon layer 53, gate insulating layer 54 and a gate electrode 56, which may be used as a pixel TFT for an LCD panel or an addressing TFT for an OELD panel, is formed on the left side. On the right side of the TFT, a storage capacitor including a amorphous silicon layer 53 connected to the drain of the TFT, a dielectric layer 55 and a capacitor electrode 57 is formed. After forming a TFT and a storage capacitor as described above, N type or P type dopant is injected into the silicon layer by using low-energy high-concentration doping process and high-energy low-concentration doping process using the gate insulating layer 54, the gate electrode 56, the dielectric layer 55 and the capacitor electrode as a mask. Then a lightly doped region 58 such as LDD (lightly doped drain) region is formed in the silicon layer of the TFT in the region covered with the gate insulating layer around the channel region. An LDD region formed in a TFT has effects of reducing the off current and improving other electrical characteristics of the TFT. A lightly doped region 59 may also be formed in a part of the capacitor region under the dielectric layer 55. The lightly doped region 59, however, does not affect the performance of the capacitor. High concentration of impurity is doped in the amorphous silicon region 60, 60' on both sides of the gate insulating layer 54 to form source 60 and drain 60' region of a TFT.

A process of crystallizing the amorphous silicon layer as shown in FIGS. 5A and 5B by means of MILC will be described below. Polycrystalline silicon TFT panels for LCD or OELD were conventionally fabricated by crystallizing an amorphous silicon layer using solid phase crystallization (SPC), laser crystallization, rapid thermal annealing (RTA), and the like. These methods, however, tend to cause damages to the substrate and fail to provide satisfactory uniformity of crystal quality. These limitations pose difficulties in the fabrication of polycrystalline silicon TFT panel. To overcome the aforementioned disadvantages of the conventional silicon crystallization methods, a method of inducing crystallization of an amorphous silicon layer at a low temperature about 200° C. by contacting or implanting metals such as nickel, gold, and aluminum has been proposed. This phenomenon that low-temperature crystallization of amorphous silicon is induced with metal is conventionally called as metal induced crystallization (MIC). However, this metal induced crystallization (MIC) method also has following disadvantages. If a TFT is manufactured by the MIC method, the metal component used to induce the crystallization of silicon remains in the crystallized silicon providing the active layer of the TFT. The metal component remaining in the active layer causes current leakage in the channel region of the TFT.

Recently, a method of crystallizing a silicon layer by inducing crystallization of amorphous silicon in the lateral direction using a metal, which is conventionally refereed to as "metal induced lateral crystallization" (MILC), was proposed. (See S. W. Lee and S. K. Joo, *IEEE Electron Device Letter*, 17(4), p. 160, 1996) In the metal induced lateral crystallization (MILC) phenomenon, metal does not directly cause the crystallization of the silicon, but the silicide generated by a chemical reaction between metal and silicon induces the crystallization of the silicon. As the crystallization proceeds, the silicide propagates in the lateral direction of the silicon inducing the sequential crystallization of the adjacent silicon region. As the metal causing this MILC, nickel and palladium or the like are known to those skilled in the art. Crystallizing a silicon layer by the MILC, a silicide containing crystallization inducing metal moves along the lateral direction as the crystallization of the silicon layer proceeds. Accordingly, little metal component is left in the silicon layer crystallized by the MILC. Therefore, the crystallized silicon layer does not adversely affect the current leakage or other characteristics of the TFT including the silicon layer. In addition, using the MILC, crystallization of silicon may be induced at a relatively low temperature of 300° C.~500° C. Thus, a plurality of substrates can be crystallized in a furnace at one time without causing any damages to the substrates.

FIG. 6 illustrates a state where a metal layer 61 composed of metal such as Ni, Pd for inducing MILC of amorphous silicon is formed over the entire surface of the substrate using sputtering. The MILC inducing metal causes crystallization of silicon layer by MIC in the region directly contacting the metal. Other regions of the silicon layer not covered with the MILC inducing metal such as the regions under the gate insulating layer 54 and the dielectric layer 55 are crystallized by MILC propagating from the regions crystallized by MIC. The MILC inducing metal deposited on the gate insulating layer 54, gate electrode 56, the dielectric layer 57 and the capacitor electrode 57 does not affect the crystallization of the amorphous silicon layer since it does not react with insulating material or metal.

A substrate covered with MILC inducing metal is subjected to heat treatment at a temperature in the range of 300° C. to 600° C. Portions of amorphous silicon layer directly covered with the MILC inducing metal are crystallized by MIC and the remaining portion of amorphous silicon layer not covered with the MILC inducing metal is crystallized by MILC propagating from the portions covered with the MILC inducing metal. The arrows in FIG. 6 indicate the propagation direction of MILC. Typically, the channel width "a" corresponding to the width of the gate electrode is about 10 $\mu$m and the width of the dielectric layer of the storage capacitor is about 15–30 $\mu$m. As shown in FIG. 6, the channel region of the TFT is crystallized by MILC propagating from both sides of the channel region and the amorphous silicon layer in the capacitor area is crystallized by the MILC propagating in one direction, that is, from the drain of the TFT. Therefore, the TFT channel region can be crystallized within a time during which MILC propagates by 5 $\mu$m in amorphous silicon. Meanwhile, it requires a time during which MILC propagates 15–30 $\mu$m in amorphous silicon to crystallize the amorphous silicon layer in the capacitor region. The silicon layer in the capacitor region crystallized by MILC constitutes a conducting layer facing the capacitor electrode 57 from both sides of the dielectric layer 55. If the crystallization by MILC is terminated before the entire area of the amorphous silicon in the capacitor region is crystallized, the area of the conducting layer becomes smaller than the designed area. Then the storage capacitor may not have desired capacitance. If the amorphous silicon layer in the capacitor region is crystallized by MILC propagating in one direction, the MILC process has to be continued until the crystallization front of MILC completely traverse the entire width of capacitor region. The long duration of crystallization process reduces the productivity of the TFT fabrication and increases the possibility that thermal damages are caused to the substrate.

SUMMARY OF INVENTION

Therefore, it is an object of the present invention to solve these problems as mentioned above, more particularly, to provide a storage capacitor structure and a fabrication method thereof that may simultaneously form a storage capacitor with an LCD pixel TFT or with an OELD addressing TFT and may reduce the time required to crystallize the silicon layer of the storage capacitor.

According to one aspect of the present invention, there is provided a crystalline silicon TFT panel for a TFT LCD panel, comprising a transparent substrate including a plurality of unit pixel region; a pixel transistor formed in each of the unit pixel region and including a crystalline silicon active layer, a gate insulating layer and a gate electrode which are sequentially formed on the substrate; and a storage capacitor formed in each of the unit pixel region and including a crystalline silicon layer, a dielectric layer and a capacitor electrode which are sequentially formed on the substrate. The crystalline silicon layers of the pixel transistor and the storage capacitor are simultaneously formed by depositing an amorphous silicon layer, applying MILC inducing metal on at least a portion of the amorphous silicon layer and conducting a thermal treatment; and the crystalline silicon layer of said storage capacitor extends outwardly from the outer boundary of the dielectric layer in at least two directions; and the MILC inducing metal is applied on the portions of the silicon layer extending from the outer boundary of the dielectric layer.

The present invention may fabricate a storage capacitor during the process of forming a pixel transistor in the unit pixel region without introducing any additional process. By applying the MILC inducing metal along the boundary of the dielectric layer, the present invention may reduce the time required to crystallize the silicon layer of the storage capacitor. The inventive technique can be also applied to fabrication of a crystalline TFT panel for an OELD panel.

BRIEF DESCRIPTION OF THE DRAWINGS

The embodiments of the present invention will be explained with reference to the accompanying drawings, in which.

DETAILED DESCRIPTION OF THE INVENTION

Hereinafter, preferred embodiments according to the present invention will be explained in detail with reference to the accompanying drawings.

Figure 7A:
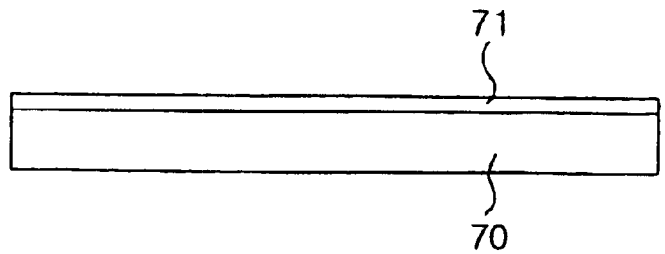
FIGS. 7A to 7L illustrate a process for forming a storage capacitor in a unit pixel region for LCD or OELD panel.

FIG. 7A shows a buffer layer 71 formed on a substrate 70 to prevent diffusion of contaminants. The substrate 70 may be composed of a transparent insulating material such as Corning 1737 glass, quartz glass, silicon oxide or the like. The buffer layer is formed by depositing silicon oxide ($SiO_2$), silicon nitride ($SiN_x$), silicon oxynitride ($SiO_xN_y$) or the composite material thereof at temperature of about 600° C. or lower and to thickness of 300 to 10,000 Å, more preferably 500 to 3,000 Å, using a vapor deposition method such as PECVD (plasma-enhanced chemical vapor deposition), LPCVD (low-pressure chemical vapor deposition), APCVD (atmospheric pressure chemical vapor deposition), ECR-CVD (Electron Cyclotron Resonance CVD), etc.

Figure 7B:
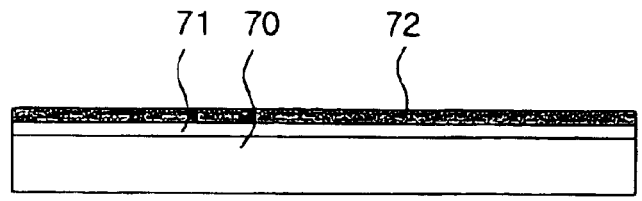

As shown in FIG. 7B, an amorphous silicon (a-Si:H) layer 72 is formed on the buffer layer 71 to provide an active layer of a TFT and a conducting layer of a storage capacitor. The amorphous silicon layer 72 can be formed by performing vapor deposition of amorphous silicon to thickness of 100 to 3,000 Å, more preferably 500 to 1,000 Å, using PECVD, LPCVD or sputtering. The amorphous silicon layer 33 is patterned to have shapes corresponding to an active layer of a TFT and a conducting layer of a storage capacitor by dry etching using a photoresist mask.

The drawings following FIG. 7B illustrate a process of simultaneously forming a storage capacitor with a pixel TFT of LCD panel or an addressing TFT of OELD panel in a unit pixel region of an LCD panel or an OELD panel. While forming the pixel elements of an LCD or an OELD panel, driving circuit elements may be formed in the driving circuit region. However, descriptions of the driving circuit elements will be omitted. In order to fabricate a TFT panel for an OELD panel, additional pixel driving TFT needs to be formed in a unit pixel region. The pixel driving TFT has the same structure as the addressing TFT and is fabricated by the same process as that of the addressing TFT. Therefore, specific description on the structure and the fabrication method of the pixel driving TFT of an OELD panel is omitted. Unless otherwise described, it should be understood that an addressing TFT and a pixel driving TFT are simultaneously formed in a unit pixel region of an OELD panel to have the same structure using the same method.

Figure 7C:
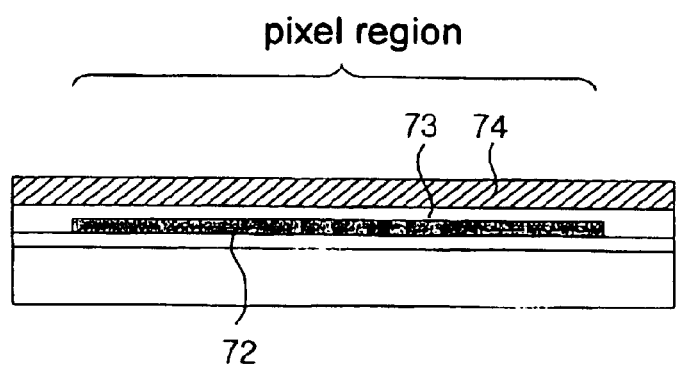

After patterning amorphous silicon in a unit pixel region into a silicon island of a predetermined shape, an insulating layer 73 that is to provide a gate insulating layer of a TFT and a dielectric layer of a storage capacitor is formed on the silicon island, as shown in FIG. 7C. Then, a conducting layer 74 is formed thereon to provide a gate electrode of a TFT and a capacitor electrode. The insulating layer 73 can be formed by performing vapor deposition of silicon oxide ($SiO_2$), silicon nitride ($SiN_x$), silicon oxynitride ($SiO_xN_y$) or the composite material thereof to a thickness of 300 to 3,000 Å, more preferably 500 to 1,000 Å, using a vapor deposition method such as PECVD, LPCVD, APCVD, and ECR-CVD. The conducting layer 74 can be formed by depositing conductive material such as metallic material, doped polysilicon or the like onto the insulating layer 73 to a thickness of 1,000 to 8,000 Å, more preferably 2,000 to 4,000 Å, using a method such as sputtering, evaporation, PECVD, LPCVD, APCVD, and ECR-CVD.

Figure 7D:
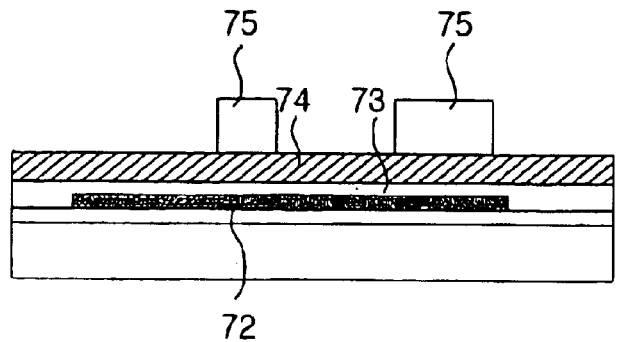
Figure 7E:
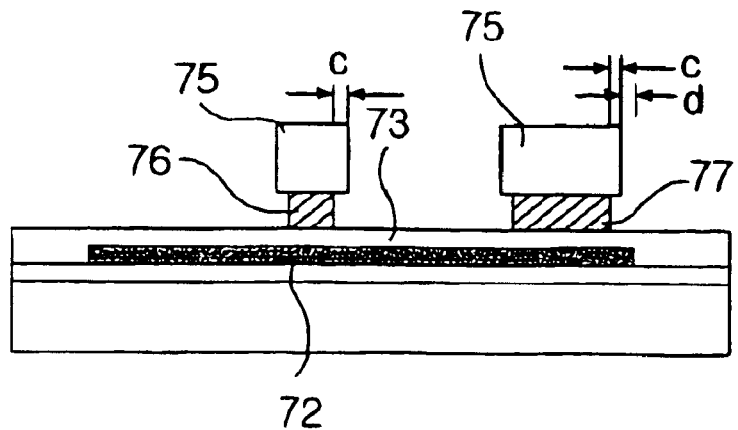

FIGS. 7D and 7E illustrate a process of forming a photoresist pattern 75 on the conducting layer 74 and patterning a gate electrode 76 and a capacitor electrode 77 by wet or dry etching using the photoresist pattern as a mask. In the embodiment of FIG. 7E, the gate electrode 76 and the capacitor electrode 77 are over-etched with respect to the photoresist mask to create a undercut structure. The gate electrode 76 is over-etched with respect to the photoresist mask in order to form a LDD region and a metal offset region around the channel region of a TFT as described later. In FIG. 7E, the photoresist pattern 77 formed on the capacitor electrode 77 is inwardly offset by a distance "d" from the outer boundary of the amorphous silicon layer 72 in the capacitor region. Thus, when the capacitor dielectric layer is patterned using the photoresist pattern as a mask, the amorphous silicon layer extends outwardly from the dielectric layer by a distance "d". In the illustrated embodiment, the silicon layers in the TFT region and the capacitor region are physically connected to each other. In actual pixel array, however, the silicon layers may be physically disconnected but electrically connected by means of wire and the like. Since this alteration of the connecting method is obvious to the ordinary skilled person in the art, further description and illustration thereof is omitted.

Figure 7F:
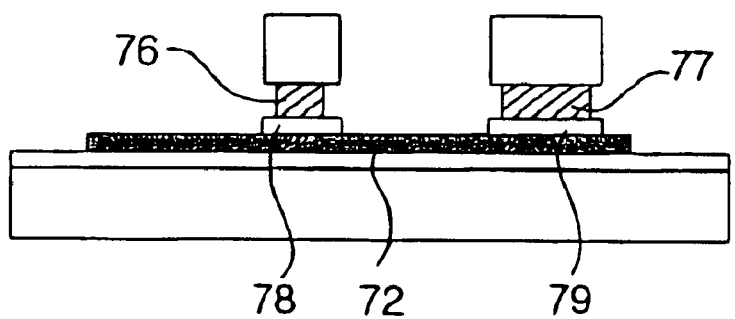

FIG. 7F illustrates a state where the insulating layer is subjected to unisotropic etching using the patterned photoresist as a mask to form a gate insulating layer 78 and a capacitor dielectric layer 79. As described above, as the gate electrode is over-etched with respect to the photoresist, the widths of the gate insulating layer 78 and the capacitor dielectric layer 79 are respectively greater than those of the gate electrode 76 and the capacitor electrode 77. Then the photoresist on the gate electrode and the capacitor electrode is removed by conventional method such as lift-off to obtain a combined structure of a TFT and a storage capacitor. A storage capacitor formed in the pixel region of the TFT panel for an LCD panel or an OELD panel typically has a capacitance in the range of 0.1–0.5 pF. To provide the desired capacitance, the dielectric layer can be formed by depositing silicon oxide ($SiO_2$), silicon nitride ($SiN_x$), silicon oxynitride ($SiO_xN_y$) or the composite material thereof to a thickness of 300 to 3,000 Å, more preferably 500 to 1,000 Å. The area of the dielectric layer is also adjusted to obtain a desired capacitance.

Figure 1:
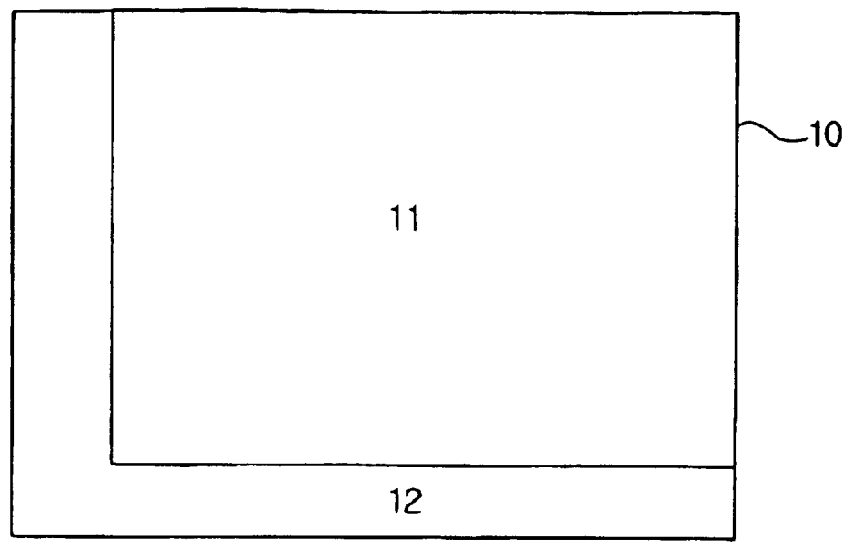
FIG. 1 illustrates a schematic layout of a TFT panel for LCD panel.
Figure 2:
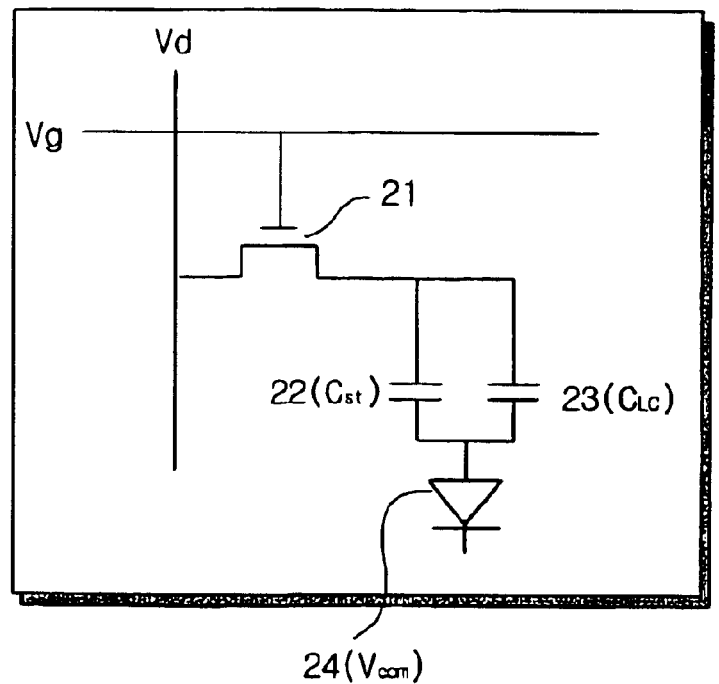
FIG. 2 is an equivalent circuit diagram of a unit pixel of a TFT panel for an LCD panel.
Figure 3:
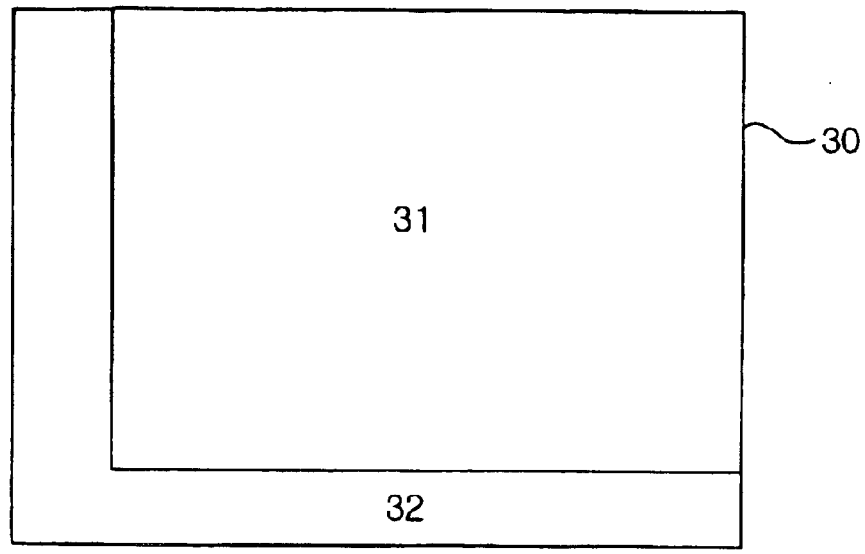
FIG. 3 illustrates a schematic layout of a TFT panel for an OELD panel.
Figure 4A:
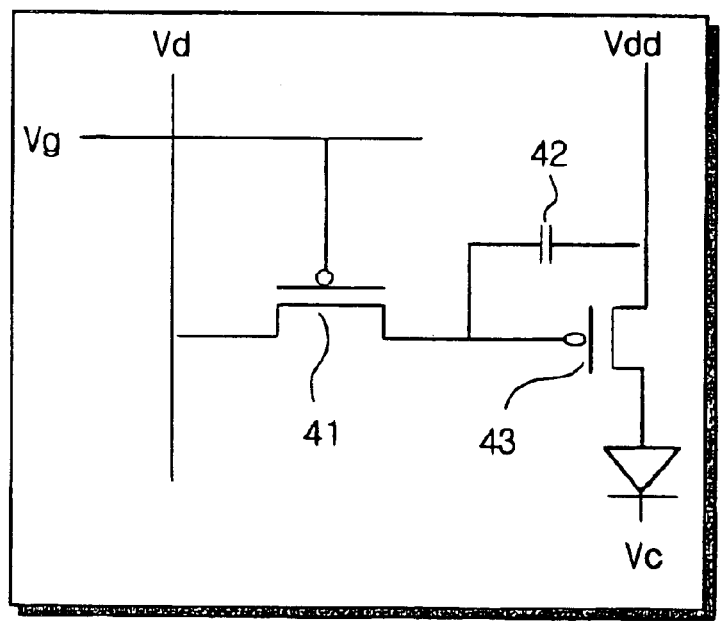
FIG. 4A is an equivalent circuit diagram of a unit pixel of a TFT panel for a voltage-driven type OELD panel.
Figure 4B:
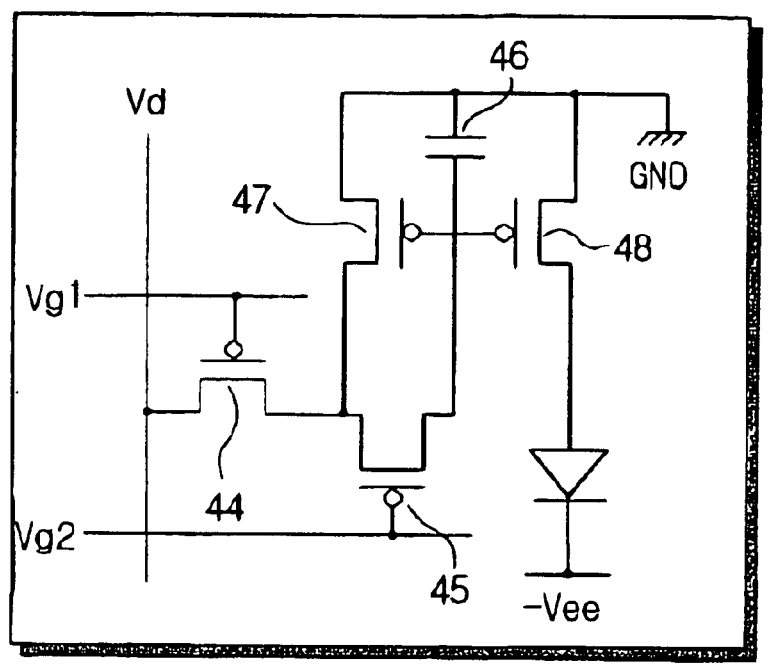
FIG. 4B is an equivalent circuit diagram of a unit pixel of a TFT panel for a current-driven type OELD panel.
Figure 5A:
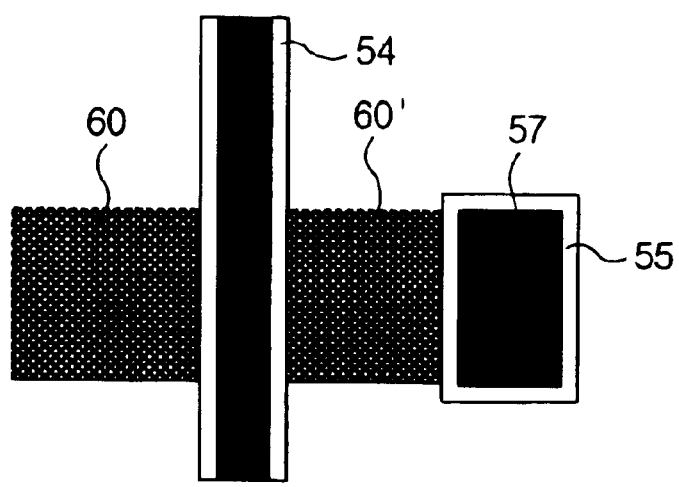
FIGS. 5A and 5B are a plan view and a sectional view of a TFT and a storage capacitor formed in a unit pixel region according to conventional art.
Figure 5B:
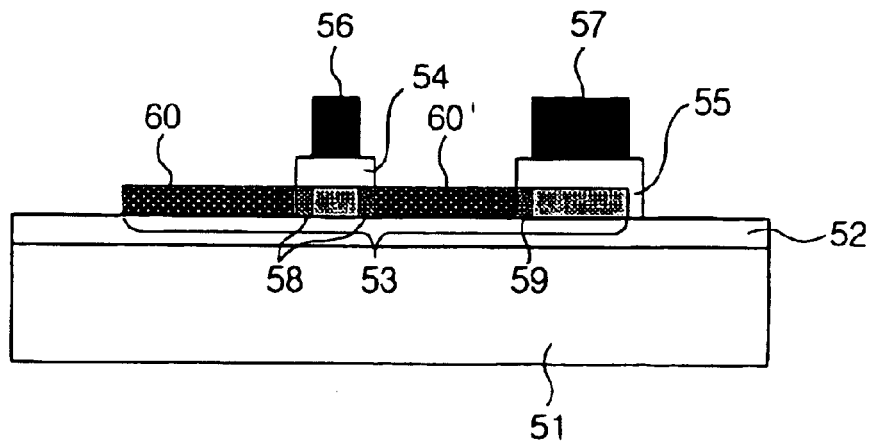
Figure 7G:
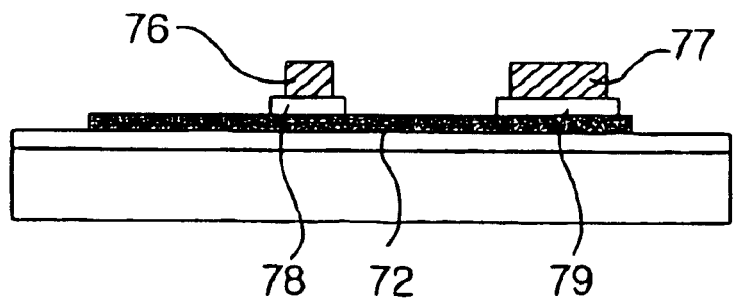
Figure 7H:
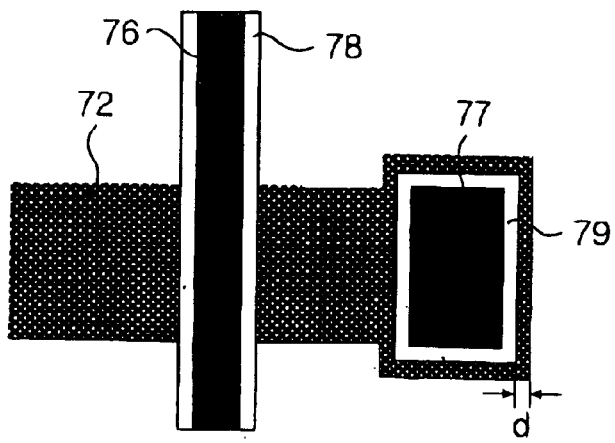

FIG. 7H is a plan view illustrating a layout of the TFT and the storage capacitor as shown in FIG. 7G. Comparing FIG. 7H with FIG. 5A, the TFT's have the same structure. The capacitor region, however, are different form each other. In FIG. 7H, an amorphous silicon layer extends beyond the outer boundary of the capacitor dielectric layer. The difference in the capacitor structure was caused since the photoresist used as a mask for forming the capacitor dielectric layer was inwardly offset from the outer boundary of the amorphous silicon layer in the capacitor region by a distance "d". The distance "d" may be adequately adjusted to induce MILC of the amorphous silicon layer under the dielectric layer. Preferred range of the distance "d" is 0.1–10 µm. In this embodiment, the silicon layer extends outwardly from all outer edges of the dielectric layer. However, within the scope of the present invention, the silicon layer may be formed to extend outwardly from some of the edges of the dielectric layer.

Figure 7I:
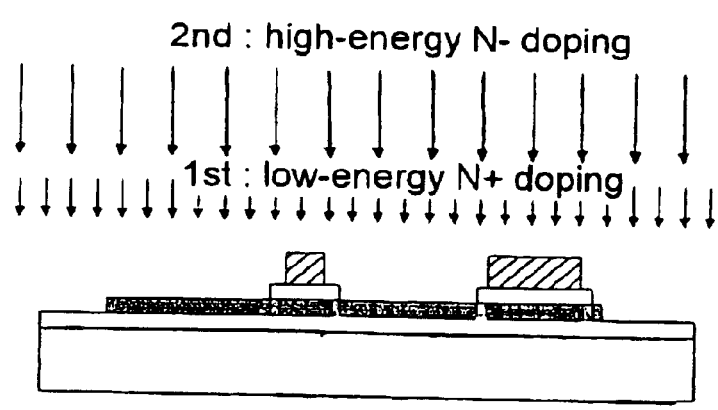

FIG. 7I illustrates a process of doping the transistor and the capacitor with impurity using the gate electrode 76 and the capacitor electrode 77 as a mask. When fabricating an NMOS (N-channel metal oxide semiconductor) TFT, the silicon layer is doped with a dopant such as $PH_3$, P and As with a dose of 1E14–1E22/$cm^3$ (preferably 1E15–1E21/$cm^3$) at an energy level of 10–200 KeV (preferably 30–100 KeV) by using ion shower doping method, ion implantation method, or another ion implantation methods. When fabricating a PMOS (P-channel metal oxide semiconductor), the silicon layer is doped with a dopant such as $B_2H_6$, B and $BH_3$ with a dose of 1E13–1E22/$cm^3$ (preferably 1E14–1E21/$cm^3$) at an energy level of 20–70 KeV. Since the impurity is injected with relatively low energy, the high-concentration impurity cannot penetrate the gate insulating layer and the capacitor dielectric layer. Thus the impurity is injected only in the silicon layer not covered by the insulating layer or by the dielectric layer to form a source region and a drain region of a TFT.

After the low-energy high-concentration doping, a high-energy low-concentration doping is conducted. The silicon layer is doped with a dopant such as $PH_3$, P and As with a dose of 1E11–1E20/$cm^3$ at an energy level of 20–100 KeV using ion shower doping method, ion implantation method or other ion implantation methods to fabricate an NMOS (N-channel metal oxide semiconductor) TFT. When fabricating a PMOS (P-channel metal oxide semiconductor) TFT, the silicon layer is doped with a dopant such as $B_2H_6$, B and $BH_3$ a dose of 1E11–1E20/$cm^3$ at an energy level of 20–100 KeV. Since the impurity is injected with high energy, the impurity may penetrate the gate electrode. Therefore, a lightly doped region is formed in the amorphous silicon layer in the region adjacent to the channel region that is covered by the gate insulating layer. To effectively suppress the off current of a pixel transistor and stabilize its electric characteristics, it is desirable that the impurity concentration of the lightly doped region is lower than 1E19/$cm^3$ and the width of the lightly doped region is in the range of 1,000–20,000 Å, and preferably in the range of 5,000–10,000 Å. In the above description, low-energy high-concentration doping was first conducted and high-energy low-concentration doping was conducted later. Within the scope of the present invention, however, the sequence of the doping process may be reversed.

Figure 7J:
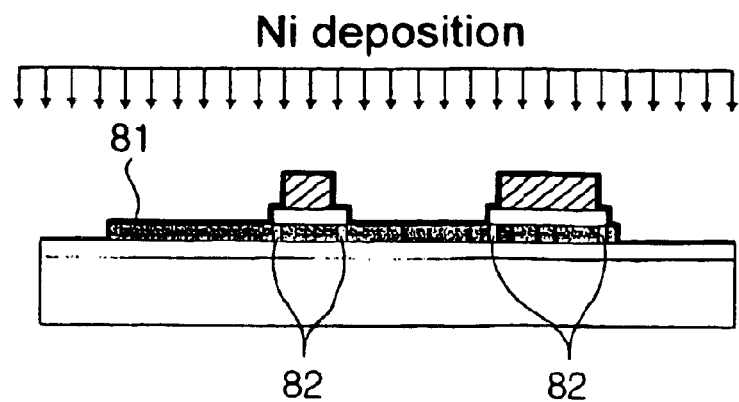

As illustrated in FIG. 7J, MILC inducing metal 81 is formed for crystallizing the amorphous silicon layer in the TFT region and the capacitor region. Ni or Pd is preferably used as the metal for inducing MILC of amorphous silicon. Other metals such as Ti, Ag, Au, Al, Sn, Sb, Cu, Co, Cr, Mo, Tr, Ru, Rh, Cd, Pt may also be used for the purpose. In this embodiment, Ni is used as MILC inducing metal. MILC inducing metal may be deposited on a silicon layer by means of sputtering, evaporation, PECVD or ion injection. Among the methods, sputtering is most typically used. The thickness of the metal layer may be selected within a range required to induce MILC of amorphous silicon layer. Preferably, the metal thickness is about 1–10,000 Å, and more preferably 10–200 Å.

As shown in FIG. 7J, a metal offset region 82 is formed in a portion around the channel region. Metal offset region is formed because the region is covered by the gate insulating layer so that the metal may not be directly applied to the silicon layer. Without forming a metal offset region around the channel region, MILC inducing metal may infiltrate into the channel region to cause current leakage and to deteriorate the operation characteristics of the TFT. In the present embodiment, a gate insulating layer patterned to have a greater width than that of gate electrode is used to form both of the lightly doped region and the metal offset region. Within the scope of the present invention, however, the metal offset region may be formed using a separate mask. Therefore, the lightly dope region and the metal offset region are not necessarily congruent to each other. A lightly doped region may be formed in a portion of a metal offset region. Since a TFT and a storage capacitor are simultaneously formed according to the present invention, a lightly doped region and a metal offset region are also formed in the silicon layer of the capacitor. However, those do not substantially affect the performance the capacitor. In the above description, impurity doping was conducted before application of MILC inducing metal. Within the scope of the invention, however, MILC metal may be applied before impurity doping.

Figure 7K:
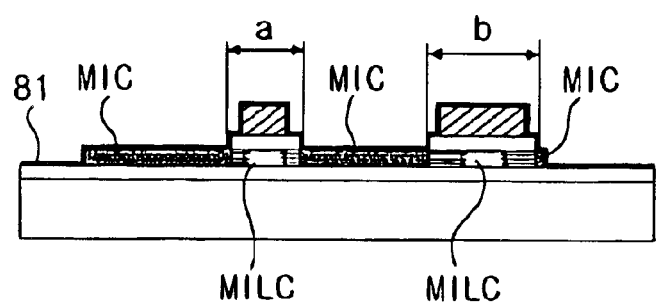

After applying MILC inducing metal, a heat treatment process for crystallizing the amorphous silicon layer in the transistor region and the capacitor region is conducted, as shown in FIG. 7K. Heat treatment can be performed using any method the causes MILC to amorphous silicon. For example, RTA (rapid thermal annealing) or ELC (excimer laser crystallization) method can be used. The RTA method heats the substrate at a temperature range of 700° C.~800° C. for a few seconds or a few minutes using a heating lamp such as tungsten-halogen lamp or a xenon arc lamp. The ELC method heats the substrate at a very high temperature for a very short time using excimer laser. In the present invention, furnace annealing method which heats a substrate in a furnace at a temperature of 400–600° C. for 0.1–50 hours, preferably for 0.5–20 hours. Furnace annealing has an advantage of preventing deformation or damage of the substrate because the heating temperature is lower than the deformation temperature of a glass substrate. Further, furnace annealing may treat a plurality of substrates at a time. Thus, furnace annealing has a higher productivity compared to other methods. During heat treatment, portions of amorphous silicon layer directly covered with MILC inducing metal is crystallized by MIC and other portions on which MILC inducing metal is not applied are crystallized by MILC propagating from the portions crystallized by MIC. Since the annealing condition for crystallizing amorphous silicon by MILC is similar to the activation conditions of the dopant injected into silicon active layer, crystallization and activation of an active layer may be conducted at a time.

Figure 6:
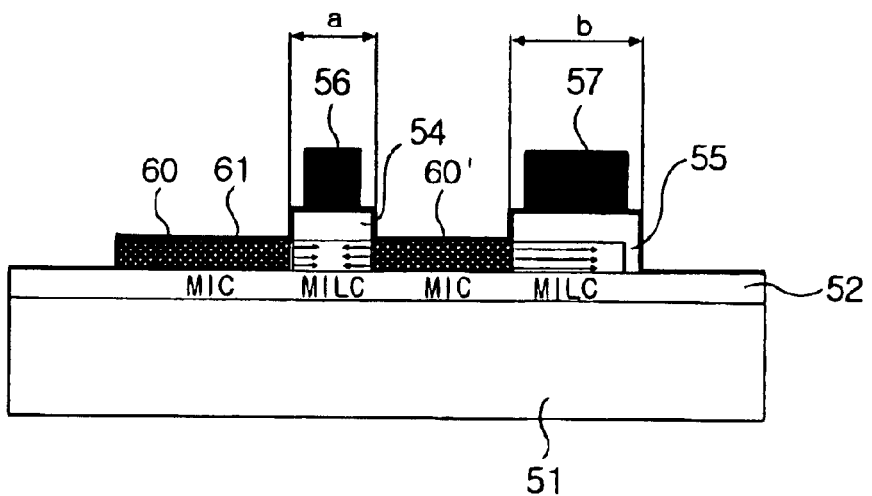
FIG. 6 is illustrates a state where the silicon layer of a TFT and the silicon layer of a capacitor are crystallized by MIC and MILC.

During the heat treatment, source region and drain region of the transistor are crystallized by MIC caused by Ni, which is directly applied on the regions. Lightly doped region and channel region of the transistor are crystallized by MILC propagating in two directions from the source region and the drain region. Meanwhile, the silicon layer in the capacitor region is crystallized by MILC caused by Ni applied to the portions of the silicon layer that extend outwardly from the outer boundary of the capacitor dielectric layer. The inventive feature of the present invention can be clearly understood by comparing FIG. 6 and FIG. 7K with each other. According to conventional art, the silicon layer in the capacitor region having a width "d" of 15–30 μm was crystallized by MILC propagating only in one direction as shown in FIG. 6. Therefore, it took much longer than the time required to crystallize the channel region having width "a" of about 10 μm by MILC propagating from both sides of the channel region. According to the present invention, the silicon layer in the capacitor region is crystallized by MILC propagating from Ni formed on both sides of the capacitor region. Thus, the time required to crystallize the silicon layer in the capacitor region can be reduced to less than a half of the time required when using a conventional method. According to the present invention, after Ni is applied, the channel region of the TFT and the silicon layer in the capacitor region are crystallized simultaneously. Since crystallized silicon has a higher electron mobility than that of amorphous silicon, it can increase the operation speed of the TFT. At the same time, the crystallized silicon layer may be used as an electrode of the storage capacitor. The completed storage capacitor has a structure in which a dielectric layer made of a material same as that of the gate insulating layer is interposed between a poly-crystalline silicon layer and a capacitor electrode made of the same material as the gate electrode.

Figure 7L:
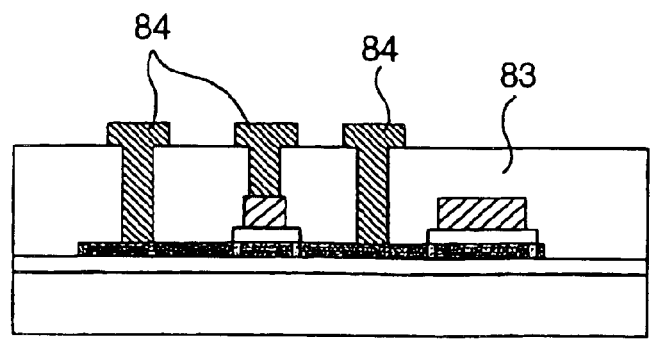

After the active layer of the transistors in the pixel region and driving circuit region is crystallized, an intermediate insulating layer 83 is formed as shown in FIG. 7L. The intermediate insulating layer may be formed by depositing silicon oxide ($SiO_2$), silicon nitride ($SiN_x$), silicon oxynitride ($SiO_xN_y$) or the composite material thereof to a thickness of 1,000 to 15,000 Å, more preferably 3,000 to 7,000 Å using PECVD, LPCVD, APCVD, ECR CVD or sputtering. FIG. 7L shows a state where the intermediate layer is etched using a photoresist pattern as a mask to form contact holes and contact electrodes 84 are formed through the contact holes. The contact electrodes are formed by depositing conductive material such as metal or doped poly-crystalline silicon to a thickness of 500 to 10,000 Å, more preferably 3,000 to 7,000 Å and patterning the conductive material by dry or wet etching into desired shapes.

Over the contact electrode, an insulating layer is formed. A TFT panel for an LCD panel is complete by forming pixel electrodes. A TFT panel for an OELD panel is completed by forming a metal electrode to be used as a cathode electrode and an ITO transparent electrode to be used as an anode electrode. Since the electrode forming process is well known in the art, detailed description thereon is omitted.

Figure 8A:
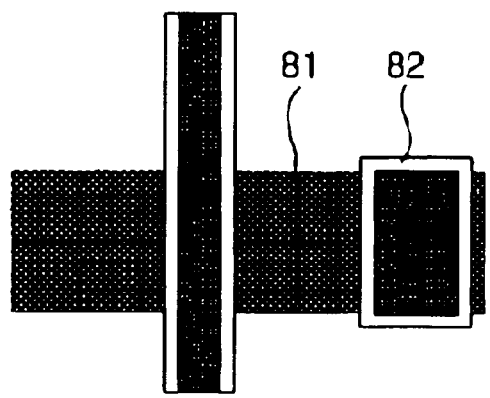
FIGS. 8A to 8D illustrate the configurations of the capacitors to which the present invention can be applied.
Figure 8B:
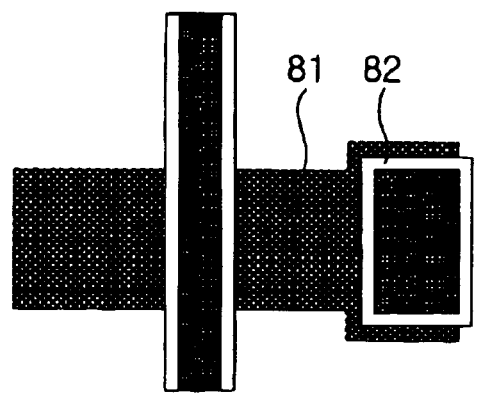
Figure 8C:
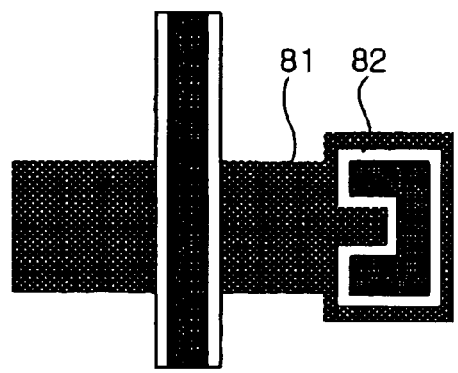
Figure 8D:
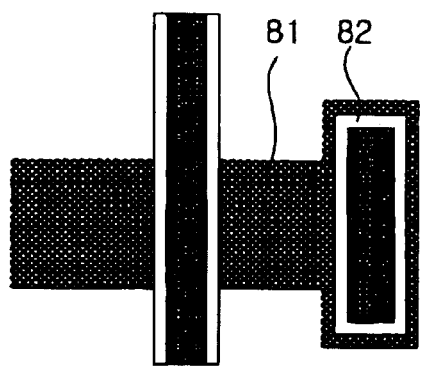

In FIG. 7H, an example of a capacitor structure in which a silicon layer extends beyond the outer boundary of a capacitor dielectric layer so that MICL inducing metal may be applied to the silicon layer along the side edges of the dielectric layer. However, within the scope of the present invention, the shapes of the dielectric layer and the silicon layer surrounding the dielectric layer may be altered in various ways. For example, FIG. 8A illustrates a structure where a silicon layer 81 extends beyond a capacitor dielectric layer 82 in two opposing edges of the dielectric layer. When the width of the dielectric layer is smaller than the its length along the longitudinal direction of the gate electrode, this structure has the same effect in reducing the crystallization time as the structure as shown in FIG. 7H. As shown in FIG. 8B, the silicon layer may extend beyond three outer edges of dielectric layer. This structure also has virtually the same effects as the structures exemplified above. FIG. 8C illustrates a case where one side of the capacitor dielectric layer is caved in to have a shape of Π. In this structure, the actual width of the silicon layer to be crystallized by MILC and accordingly its crystallization time is reduced. Optionally, the capacitor dielectric layer may be caved in from both sides. Or, as shown in FIG. 8D, the dielectric layer 82 has an elongated shape. This structure is also effective in reducing the crystallization time of the silicon layer.

Although the present invention has been described with respect to the preferred embodiments thereof, the present invention is not limited to the embodiments and various modifications and changes based on the technical features of the present invention may fall within the scope of the invention. Therefore, it should be understood that a person having an ordinary skill in the art to which the present invention pertains can make various modifications and changes to the present invention without departing from the spirit and scope of the invention defined by the appended claims.

The present invention has advantageous effects of simultaneously forming a crystalline silicon TFT and a storage capacitor in the pixel region of a TFT panel for LCD or OELD using MILC technique. The silicon layer crystallized by MILC provides the active layer of a TFT and an electrode of a storage capacitor at the same time. By adjusting the shapes of the capacitor dielectric layer and the silicon layer surrounding the dielectric layer, the time required to crystallize the silicon layer in the capacitor region can be significantly reduced.

What is claimed is:

1. A crystalline silicon TFT panel for a TFT LCD panel, comprising:

a transparent substrate including a plurality of unit pixel region;

a pixel transistor formed in each of the unit pixel region and including a crystalline silicon active layer, a gate insulating layer and a gate electrode which are sequentially formed on the substrate;

a storage capacitor formed in each of the unit pixel region and including a crystalline silicon layer, a dielectric layer and a capacitor electrode which are sequentially formed on the substrate;

wherein, the active layer of said pixel transistor and the crystalline silicon layer of said storage capacitor are connected to each other and simultaneously formed of the same material by depositing an amorphous silicon layer, applying MILC inducing metal on at least a portion of the amorphous silicon layer and conducting a thermal treatment; and the crystalline silicon layer of said storage capacitor extends outwardly from the outer boundary of the dielectric layer in at least two directions; and the MILC inducing metal is deposited on the portions of the silicon layer extending from the outer boundary of the dielectric layer; and wherein, said crystalline silicon layer extends from the outer boundary of the dielectric layer by a distance of 0.1 to 10 μm.

2. The crystalline silicon TFT panel according to claim 1, wherein the dielectric layer of said storage capacitor has a rectangular shape and the silicon layer below the dielectric layer extends outwardly from at least two side edges of the dielectric layer.

3. The crystalline silicon TFT panel according to claim 2, wherein at least one of the two opposing sides of the dielectric layer is caved into a shape of Π.

4. The crystalline silicon TFT panel according to claim 1, wherein said dielectric layer has of thickness of 300 to 3,000 Å.

5. The crystalline silicon TFT panel according to claim 1, wherein the crystalline silicon layer of said pixel transistor and the crystalline silicon layer of said capacitor are connected to each other; and the gate insulating layer of said pixel transistor and the dielectric layer of said storage capacitor are simultaneously formed using the same material; and the gate electrode of said pixel transistor and the capacitor electrode of said storage capacitor are simultaneously formed using the same material.

6. The crystalline silicon TFT panel according to claim 1, wherein the MILC inducing metal is selected from a group of comprising Ni, Pd, Ti, Ag, Au, Al, Sn, Sb, Cu, Co, Cr, Mo, Tr, Ru, Rh, Cd and Pt; and the MILC inducing metal is applied to a thickness of 1 to 200 Å using sputtering, evaporation or CVD; and the thermal treatment is conducted in a furnace at a temperature of 400 to 600° C. for 0.1 to 50 hours.

7. A crystalline silicon TFT panel for an OELD panel, comprising:

a transparent substrate including a plurality of unit pixel region;

at least two thin film transistors formed in each of the unit pixel region, each of the thin film transistor including a crystalline silicon active layer, a gate insulating layer and a gate electrode which are sequentially formed on the substrate;

a storage capacitor formed in each of said unit pixel region and including a crystalline silicon layer, a dielectric layer and a capacitor electrode which are sequentially formed on the substrate;

wherein the active layer of said pixel transistor and the crystalline silicon layer of said storage capacitor are connected to each other and simultaneously formed of the same material by depositing an amorphous silicon layer, applying MILC inducing metal on at least a portion of the amorphous silicon layer and conducting a thermal treatment; and the crystalline silicon layer of said storage capacitor extends outwardly from the outer boundary of the dielectric layer in at least two directions; and the MILC inducing metal is deposited on the portions of the silicon layer extending from the outer boundary of the dielectric layer; and wherein, said crystalline silicon layer extends from the outer boundary of the dielectric layer by a distance of 0.1 to 10 μm.

8. The crystalline silicon TFT panel according to claim 7, wherein the dielectric layer of said storage capacitor has a rectangular shape and the silicon layer below the dielectric layer extends outwardly from at least two side edges of the dielectric layer.

9. The crystalline silicon TFT panel according to claim 8, wherein at least one of the two opposing sides of the dielectric layer is caved into a shape of Π.

10. The crystalline silicon TFT panel according to claim 7, wherein said dielectric layer has of thickness of 300 to 3,000 Å.

11. The crystalline silicon TFT panel according to claim 7, wherein the crystalline silicon layer of at least one of said thin film transistor and the crystalline silicon layer of said capacitor are connected to each other; and the gate insulating layer of said thin film transistor and the dielectric layer of said storage capacitor are simultaneously formed using the same material; and the gate electrode of said thin film transistor and the capacitor electrode of said storage capacitor are simultaneously formed using the same material.

12. The crystalline silicon TFT panel according to claim 7, wherein the MILC inducing metal is selected from a group of comprising Ni, Pd, Ti, Ag, Au, Al, Sn, Sb, Cu, Co, Cr, Mo, Tr, Ru, Rh, Cd and Pt; and the MILC inducing metal is applied to a thickness of 1 to 200 Å using sputtering, evaporation or CVD; and the thermal treatment is conducted in a furnace at a temperature of 400 to 600° C. for 0.1 to 50 hours.

* * * * *